United States Patent [19]

Daughters

[11] Patent Number: 5,811,961
[45] Date of Patent: Sep. 22, 1998

[54] AMPLITUDE AND PHASE ADJUSTMENT CIRCUIT

[75] Inventor: Timothy Edward Daughters, Westwood, Mass.

[73] Assignee: Lucent Technologies Inc., Murray Hill, N.J.

[21] Appl. No.: 691,286

[22] Filed: Aug. 1, 1996

[51] Int. Cl.[6] .................................................. G05F 1/00
[52] U.S. Cl. ........................ 323/213; 323/218; 333/117; 333/121
[58] Field of Search ............................... 323/212, 213, 323/218, 208; 333/117, 118, 124, 121

[56] References Cited

U.S. PATENT DOCUMENTS

| 4,763,074 | 8/1988 | Fox ........................................ 324/314 |
| 5,557,247 | 9/1996 | Vaughn, Jr. .............................. 333/219 |
| 5,619,061 | 4/1997 | Goldsmith et al. ...................... 257/528 |

*Primary Examiner*—Peter S. Wong
*Assistant Examiner*—Shawn Riley

[57] ABSTRACT

An amplitude and phase cancellation circuit for modifying or reducing the phase and amplitude of a signal includes a quadrature hybrid having four ports. A first port receives an input signal and a fourth port outputs an output signal derived from the input signal. The remaining two ports are connected to circuit sections having tuneable and adjustable components for selectively varying the phase and amplitude of the output signal. When the output signal is combined or mixed with an external signal, the circuit allows for selective adjustment or cancellation of components of the external signal by generating an output signal having a phase angle opposite to and amplitude equal to the external signal components for which cancellation is desired.

19 Claims, 4 Drawing Sheets

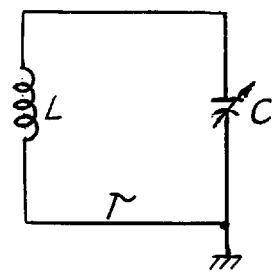
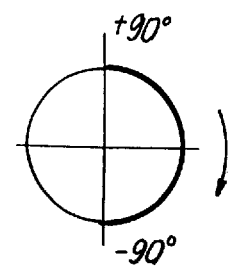
FIG.4A    FIG.4B
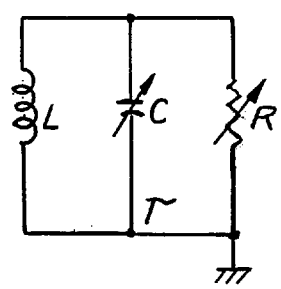
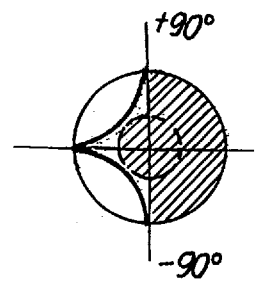
FIG.5A    FIG.5B

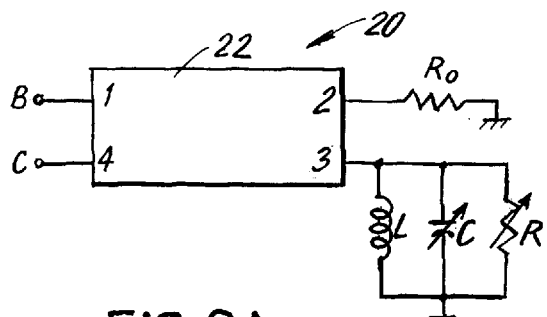
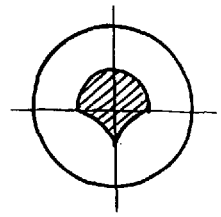
FIG.6A        FIG.6B
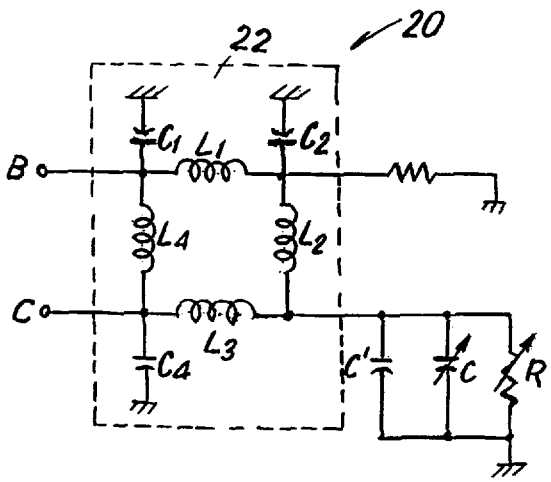
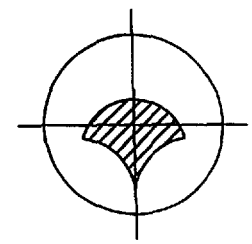
FIG.6C        FIG. 7
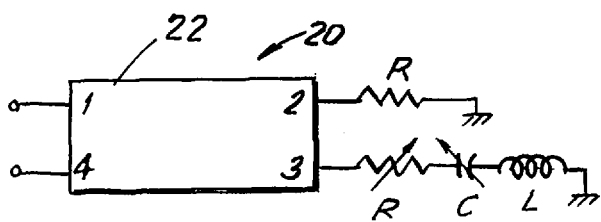
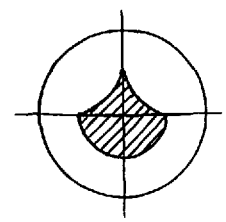
FIG.8A        FIG.8B

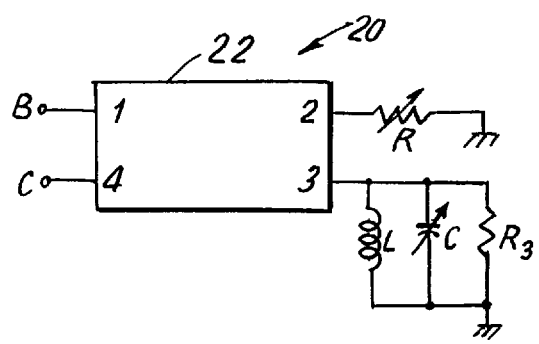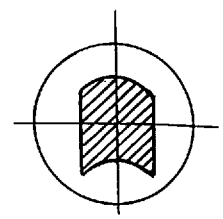
FIG.9A  FIG.9B
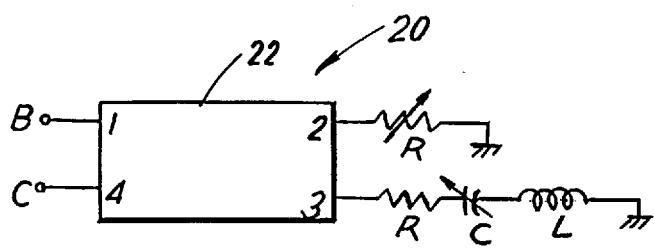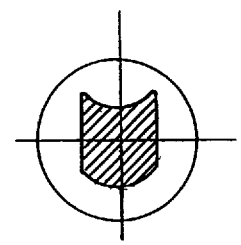
FIG.10A  FIG.10B

AMPLITUDE AND PHASE ADJUSTMENT CIRCUIT

BACKGROUND OF THE INVENTION

I. Field of the Invention

The present invention pertains to an electric circuit for adjusting and compensating for amplitude and phase variations in an input signal.

II. Discussion of Related Art

Phase and amplitude compensation circuits are typically required for cancelling out or reducing unwanted frequency components of an input signal when such unwanted components are difficult to conventionally filter out or otherwise remove. For example, in many electronics applications, circuits are needed for controlling the phase and amplitude of an electric signal so that the phase and amplitude can be adjusted, regulated and, in some instances, cancelled. One such application where phase and amplitude adjustment is needed is in transmitter communications circuits wherein an input signal is provided to a mixer for mixing with a local oscillator (LO) signal having a fixed carrier frequency for shifting or heterodyning the input signal to a higher frequency. The mixer is usually a double balanced or a single balanced mixer. In an ideal mixer, the resulting output signal is contained in two frequency bands; a first or higher band having frequency components equal to the sum of the input signal frequency and the carrier frequency of the LO, and a second or lower band having frequency components equal to the difference between the frequency of the input signal and the LO carrier frequency. The resulting signal will be a double side band suppressed carrier format. Alternatively, one of the side bands can be filtered out to produce a single side band signal.

The problem with such a heterodyne system is that the mixers used for shifting the input signal are not ideal. Accordingly, not only will the mixer pass both of the aforementioned frequency bands, but it will also unintentionally leak or pass a portion of the local oscillator signal. This creates an unwanted interference and degradation of the input signal, because oftentimes the leaked local oscillator signal is greater in amplitude than the input signal. It can be difficult to filter out the undesired LO leakage because of its high amplitude and close proximity in frequency to the desired signal. One way to eliminate this interfering signal is to add a signal to the mixer output that is equal in amplitude and frequency but opposite in phase to the leaked LO signal. This cancelling signal can be generated by passing a sample of the LO signal through a phase and amplitude adjustment circuit such that the output of such circuit will be equal in amplitude and opposite in phase to the LO leakage signal.

SUMMARY OF THE INVENTION

An improvement is made in the art by providing an electric circuit for controlling the phase of an input signal within a 360° phase range while simultaneously reducing the amplitude of the input signal. The inventive circuit has an input and an output for receiving through the circuit input an input signal having a frequency component with a corresponding amplitude and phase angle, and for outputting from the circuit output an output signal derived from the input signal and having the same frequency component as the input signal with a corresponding output signal amplitude and phase angle in the range of 0° to 360° which is different than the amplitude and phase angle of the input signal. The circuit contains a generally conventional quadrature hybrid having four ports (a first port, a second port, a third port and a fourth port), with the first port functioning as the circuit input and the fourth port functioning as the circuit output. In accordance with the invention, a first circuit section or arrangement of elements having a first impedance value and connected to one of the second and third ports defines a first reflection coefficient and a second selectively tunable circuit section or arrangement of elements having a second selectively variable impedance value is connected to the other of the second and third ports to define a tunable second reflection coefficient. The first and second circuit sections are configured so as to selectively define the first and second coefficients for thereby selectively varying the phase angle and amplitude of the output signal within a predetermined angular range and magnitude determined by the first and second reflection coefficients.

In another embodiment, the first circuit section or arrangement also includes a tunable impedance element.

By selecting or predetermining or selectively varying the impedance values of the first and/or second reflection coefficients, the output signal can be adjustedly used to cancel out or offset, by simultaneously varying the phase angle and amplitude of the output signal, unwanted components of a composite or primary signal with which the output signal may be combined for that purpose. For example, if a composite or primary signal includes an unwanted frequency component at a phase angle of 45°, the output signal from the inventive circuit can be adjusted to produce a corresponding frequency component having a −135° phase and equal or substantially equal in amplitude which, when combined with the composite signal, will significantly reduce or effectively cancel the unwanted component.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views:

FIGS. 4A and 4B are a schematic representation of one reflection coefficient circuit and its corresponding Smith chart, respectively;

FIGS. 5A and 5B are a schematic representation of another reflection coefficient circuit and its corresponding Smith chart, respectively;

FIGS. 6A and 6B are still another reflection coefficient circuit in accordance with the present invention, and its corresponding Smith chart, respectively;

FIG. 6C is a modification of the circuit of FIG. 6A.

FIG. 7 is a Smith chart of a variation of the reflection coefficient circuit of FIG. 6A;

FIGS. 8A and 8B are a schematic representation of yet another variation of the reflection coefficient circuit of FIG. 6A and its corresponding Smith chart, respectively, in accordance with the present invention;

FIGS. 9A and 9B are a schematic representation of another reflection coefficient circuit and a corresponding Smith chart, respectively; and FIG. 10A is another variation of the circuit of FIG. 9A, and FIG. 10B is a corresponding Smith chart for the circuit of FIG. 10A.

DETAILED DESCRIPTION OF THE PRESENTLY PREFERRED EMBODIMENTS

Figure 1:
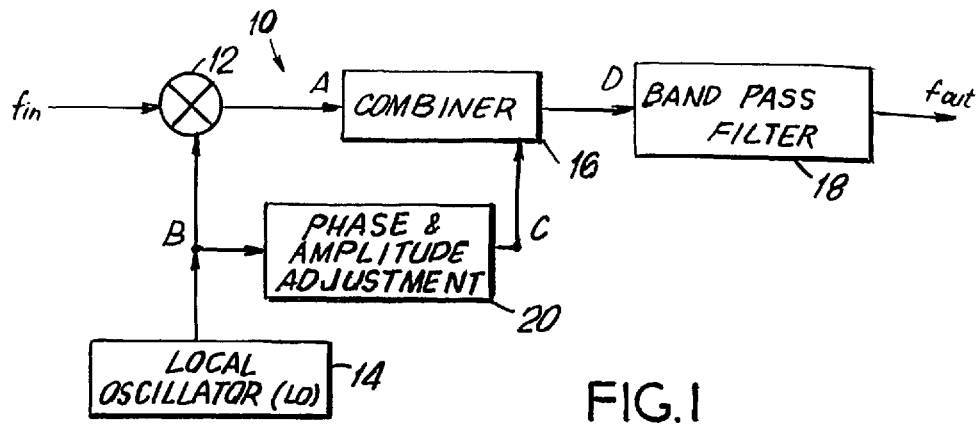
FIG. 1 is a block representation of one advantageous use of the inventive circuit.

With reference now to the figures and, initially, to FIG. 1, a block diagram of a mixer circuit 10 showing an application of the inventive circuit is there depicted. The mixer circuit 10 is typically used in communication electronics and particularly in an up-converter wherein a low frequency input signal is shifted or converted to a higher frequency by mixing it with a local oscillator signal. Although the inventive circuit is specifically discussed herein in the context of a mixer circuit for use in communications systems, it may likewise be used in a wide variety of other applications in which simultaneous amplitude reduction and phase cancellation or adjustment is necessary or desired.

As shown in FIG. 1, an input signal $f_{in}$ having an amplitude and a frequency component is input to a mixer 12 such as a single-balanced or double-balanced mixer. In this arrangement, the input signal is used to modulate a fixed frequency local oscillator signal $f_{LO}$ that is generated by a local oscillator (LO) 14 and which is also provided to mixer 12. As is well known by those having ordinary skill in the art, the composite signal output from mixer 12 is contained within separate frequency bands—a first or high frequency band containing a signal consisting of the sum of the frequency components of signal $f_{in}$ and the local oscillator signal, and a second or low frequency band containing a signal consisting of the difference between these two signals $f_{in}$ and $f_{LO}$. In some instances, such as for single side band applications, only one frequency band is retained and the other is removed by filtering. In other instances, such as for double side band applications, both frequency bands are used. However, due to the physical properties of the mixer 12, a portion of the LO signal is itself passed through or leaked by the mixer. This is undesirable because it is inefficient to transmit the power of the leaked LO signal and the leaked LO signal may also interfere with adjacent channels.

To overcome the difficulty involved in filtering out the LO leakage and in accordance with the present invention, a phase and amplitude adjustment circuit 20 is provided between LO 14 and the output of mixer 12. Specifically, the phase and amplitude adjustment circuit 20 receives the LO signal—which has a known fixed frequency—as an input at node B and outputs a signal (at node C) having the same known frequency as the LO signal which is combined with the output of mixer 12 via a combiner 16. The signal at node C is preferably, at least in this particular application or use of the invention, substantially equal in magnitude and opposite in phase to the LO leakage, thus cancelling out the LO leakage from the combined signal. The resulting combined signal output from combiner 16 may then be provided (for single side band applications) to a band pass filter 18 (at position D) which filters out and removes the low frequency "difference" band (or, in the alternative, the high frequency "summation" band), thus resulting in an output signal $f_{out}$ that is at least effectively devoid of the LO leakage signal.

Figure 2:
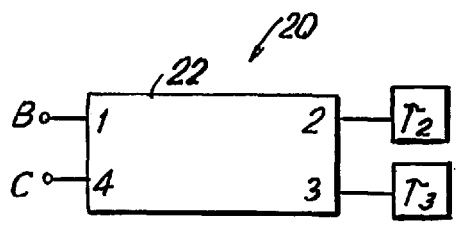
FIG. 2 is a block representation of the inventive circuit.

With reference now to FIG. 2, a block representation of the invention phase and amplitude adjustment circuit 20 is there depicted. Circuit 20 includes a microwave or hybrid junction, such (preferably) as a quadrature hybrid 22, containing four terminals or ports 1, 2, 3 and 4. Although the operation of a conventional quadrature hybrid is well known to those having ordinary skill in the art, a brief discussion will, nevertheless, be provided. When a matched load is applied to all of the terminals and a signal is input to a select port, two output signals having half the power of the input signal and different phases from the input signal are generated on the next two consecutive ports, whereas the remaining port has no output signal. For example, if an input signal having a certain power, frequency and phase angle is input to port 1, a signal having the same frequency, half the power and a 90° phase differential from the input signal is present at port 2, whereas a signal having half the power of the input signal and a 180° phase differential or shift is available and output from port 3. However, there is no signal at port 4. Likewise, if the input signal is provided to port 3, then ports 4 and 1 receive the half-power signals at 90° and 180° phase differentials, respectively, and port 2 has no output.

Utilizing these well-known operating properties of the quadrature hybrid 22, it has been discovered that by providing select and tuneable reflection coefficients $Y_2$ and $Y_3$ to two consecutive quadrature hybrid ports (such as the ports 2 and 3 in FIG. 2) to reflect to (for example) port 4 a part of the signal that is input to port 1, the phase as well as amplitude of the input signal can be predeterminantly manipulated. For example, and with specific reference to FIGS. 1 and 2, the phase and amplitude adjustment circuit 20 can receive an input signal through port 1 (such as the signal $f_{LO}$ generated from local oscillator 14) at node B, and will output a signal through the remaining port 4 at node C. As more fully described below, the characteristics of the output signal from port 4 are a function of the input signal provided to port 1, the operation of the quadrature hybrid 22, and the reflection coefficients $Y_2$ and $Y_3$ resulting from the circuit sections, or arrangements or elements connected to ports 2 and 3. Specifically, the signal coming out of port 4 is equal to the input signal multiplied by the complex quantity $j(Y_2+Y_3)/2$.

Figure 3A:
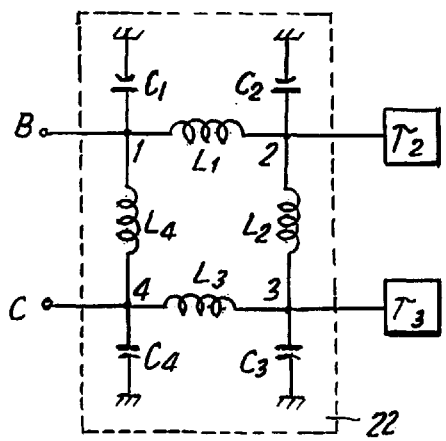
FIGS. 3A and 3B are schematic representations of a quadrature hybrid section of the inventive circuit.
Figure 3B:
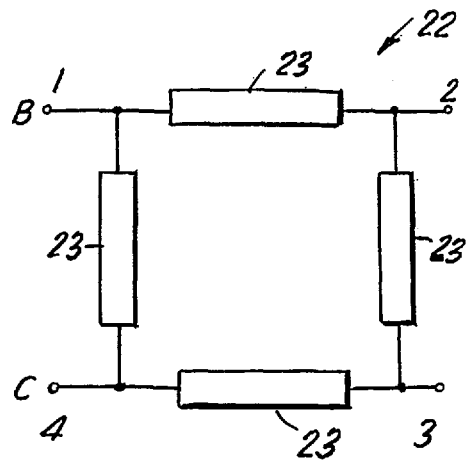

The quadrature hybrid 20 is commercially available from at least several component manufacturers. In the alternative, a quadrature hybrid can be designed or constructed from discrete inductors and capacitors arranged in the configuration shown in FIG. 3A. For higher frequency uses such, for example, as frequencies in the gigahertz range, a quadrature hybrid 22 may be manufactured from transmission lines 23 as is well known to those having ordinary skill in the art and is shown in FIG. 3B.

With reference now to FIGS. 4 and 5, a schematic representation of one example of an arrangement for providing a reflection coefficient Y is shown along with its corresponding Smith chart depicting the magnitude and phase range of vectors that can be generated in accordance with the invention from an output port of the quadrature hybrid, i.e. a 180° range between 90° and −90°. The circuit for providing a reflection coefficient Y is constructed (FIG. 4A) of a parallel arrangement of an inductor L and a variable capacitor C. As the value of the capacitance increases, the phase of the output signal changes in the direction indicated in the arrow of FIG. 4B, i.e. in the clockwise direction. Similarly, by employing the reflection coefficient circuit shown in FIG. 5A, which consists of a parallel RLC circuit wherein the resistor R and capacitor C are variable, a "balloon-shaped" scanning region—indicated as the shaded portion on the Smith chart of FIG. 5B—is created. Thus, the circuit of FIG. 5A will generate reflection vectors having phases and magnitudes within the shaded region shown on the Smith chart. The Smith chart of FIG. 5B depicts a scanning range covering all vectors with phase between +90° and −90° in a clockwise direction through 0°. It also covers vectors with phase between +90° and −90° in the counter-clockwise direction but not at all magnitudes. Vectors in the unshaded region cannot be generated.

With reference now to FIG. 6, the reflection coefficient circuit depicted in FIG. 5A is shown connected to port 3 of the quadrature hybrid 22 and a resistance R is connected to port 2. Resistance R is equal to the characteristic impedance of the quadrature hybrid $Z_0$ so that the resulting reflection from port 2 will be zero. When the circuit 20 is so constructed with the reflection coefficient as shown, i.e. with $Y_2$ equal to 0 and $Y_3$ equal to the reflective coefficient of the RLC circuit parallel configuration, the scanning or vector generation region depicted in the Smith chart of FIG. 5B is rotated 90° in a counter-clockwise direction and is reduced in size by one-half. The resulting scanning region is shown in the Smith chart of FIG. 6B. When using the discrete version of the quadrature hybrid shown in FIG. 3A, the inductor L in the reflection coefficient circuit for $Y_3$ can be eliminated by absorbing the inductor's admittance into the quadrature hybrid capacitor connected to port 3 ($C_3$). Instead of its normal value in the quadrature hybrid, $C_3$ is reduced to a value having an admittance equal to the admittance of the parallel combination of L and the normal $C_3$ value. For example, if $C_3$ normally has an admittance of 48 millisiemens, and the desired inductor L would have an admittance of −20 millisiemens, then $C_3$ would be replaced by a capacitor having an admittance of 28 millisiemens and the inductor L can be eliminated. This is shown in FIG. 6C where the inductor L has been eliminated and the simulated inductance is depicted as capacitor C'. Of course, such a substitution can only be made with the quadrature hybrid of FIG. 3A.

For some applications it is desirable to shift the shaded scanning region depicted in FIG. 6B in a downward direction so that a wider coverage of signal amplitudes at most or all phases can be generated. Shifting of the scanning region in FIG. 6B may be accomplished by suitably reducing the value of R at port 2 to a value less than the characteristic impedance of the quadrature hybrid. Thus $Y_2$ is a negative real number. The resulting shifted scanning region is depicted in the Smith chart of FIG. 7.

The Smith charts of FIGS. 6B and 7 depict a vector generation region or area within the top portion of the circle. For example, in the Smith chart in FIG. 6B, vectors having a phase between 0° and 180° in the counter-clockwise direction of FIG. 6B can be generated by the circuit in FIG. 2 but, since a much smaller portion of the shaded region is contained in the bottom part of the Smith chart in FIG. 6B, a wide scanning region in the range of 0° to 180° in the clockwise direction is not available. Likewise, because the Smith chart of FIG. 7 contains a shaded region that is of similar configuration to the region in FIG. 6B—except that it is located some vertical distance lower in the Smith chart—wide scanning is available in the region of approximately −20° to 200° in the counter-clockwise direction whereas only a narrow scanning region is available for vectors in the remaining angular range.

In certain applications, a reciprocal scanning region to that depicted in the Smith charts of FIGS. 6B and 7 can be attained by utilizing a series resonance RLC circuit to obtain the reflection coefficient $Y_3$, instead of the parallel circuit configuration depicted in FIG. 6A. Such a circuit is shown by way of example in FIG. 8A and, as depicted in the corresponding Smith chart of FIG. 8B, the reciprocal scanning region contains a widened scanning range between 0° and −180° in the clockwise direction, whereas the narrower portion of the scanning range—corresponding to fewer available vectors—is found at the upper portion of the Smith chart. Like that of FIG. 7, the scanning region of FIG. 8B can be moved in an upward or downward direction by varying the value of reflection coefficient $Y_2$, i.e. by varying the value of R.

Referring now to FIG. 9, a most preferred variation of the phase and amplitude adjustment circuit 20 of FIG. 6A is there depicted. The circuit of FIG. 9A is preferred over the afore-described circuits because, for most applications, the phase of the input signal is not known. Thus, a scanning range of 180° is too limiting and a full 360° scanning range is preferred—indeed, for some applications, a 360° range is required. As shown in FIG. 9A, with the modification the reflection coefficient $Y_2$ has been changed from a fixed value of to a variable value by connecting a variable resistor R to port 2. In this manner, $Y_2$ can be varied between +1 and −1. In addition, reflection coefficient $Y_3$ has been modified from the RLC parallel configuration of FIG. 6A by fixing the variable resistor to $R_3$. The circuit of FIG. 9A results in a "curved-rectangle" shape scanning region as depicted in the corresponding Smith chart of FIG. 9B. By varying the values of R and C and, thereby, of the respective reflection coefficients $Y_2$ and $Y_3$, vectors can be generated having phase angles and amplitudes contained within the shaded region depicted in the corresponding Smith chart, i.e. phase angles from 0° to 360°.

In a similar manner to that discussed above in comparing FIGS. 7 and 8B, the curved rectangular shape scanning region of FIG. 9B may be inverted, as shown in the Smith chart of FIG. 10B, by replacing the FIG. 9A parallel configuration circuit for defining reflection coefficient $Y_3$ with a series resonant RLC circuit depicted in FIG. 10A. The series resonant circuit includes an inductor L, a variable capacitance C, and a fixed resistance, e.g. the characteristic impedance $R_0$. As shown in the Smith chart of FIG. 10B, the resulting shaded scanning region is identical to the scanning region in the Smith chart of FIG. 9B, but with a 180° phase shift.

As should by now be apparent, the various reflection coefficient circuit configurations depicted in the hereinabove described figures allow for generation of a range of vectors in a variety of angles to predeterminately or selectively adjust, compensate for or otherwise effectively cancel unwanted components of an input signal or for other purposes. For example, and with reference once more to FIG. 1, the inventive circuit 20 may be used to cancel out the unwanted local oscillator leakage signal that unintendably leaks or passes through mixer 12. This is effected by adjusting or tuning the R and C values to generate the appropriate vectors necessary for effectively cancelling the unwanted frequency components of the input signal, i.e. the leaked local oscillator signal in FIG. 1. For example, by measuring the output signal from port 4 (node C) of the quadrature hybrid 22 while effecting for various adjustments of the resistance and capacitance, the phase and amplitude of the output signal can be selectively varied. The local oscillator leakage signal is thereby removable from the output signal $f_{out}$. Similarly, any input signal can be modified or varied by suitably tuning or adjusting the capacitance and resistance values in the reflection coefficient defining circuits.

The variable capacitance in the reflection coefficient circuits can be implemented by using a varactor diode. The variable resistance can be implemented by employing a PIN diode. It should also be recognized that the reflection coefficients $Y_2$ and $Y_3$ may be interchanged. In other words, the RLC or RC (in FIG. 6C) circuits which are depicted and described herein for defining or generating the reflection coefficient $Y_3$ and, thus, connected to port 3 of the quadrature hybrid 22 can alternatively be connected to port 2 as reflection coefficient $Y_2$, with the resistive load (variable or fixed) connected as $Y_3$ to port 3. Furthermore, although the reflection coefficient circuits are described hereinabove utilizing variable capacitors and fixed inductors, it should be readily understood by those having ordinary skill in the art that variable inductors and fixed capacitors can alternatively be used without departing from the scope of the present invention.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

I claim:

1. A circuit, having an input and an output, for receiving through the input an input signal having a frequency component with a corresponding phase angle and an input amplitude, and for outputting from the output an output signal derived from the input signal and having the frequency component of the input signal with an amplitude predeterminately different than the amplitude of the input signal and an adjustable phase angle, said circuit comprising:

a quadrature hybrid having a first port, a second port, a third port and a fourth port, said first port comprising the circuit input and said fourth port comprising the circuit output;

a first circuit means having a first impedance value and connected to one of said second and third ports for defining a first reflection coefficient; and a second selectively tunable circuit means having a second selectively variable impedance value and connected to the other of said second and third ports for defining a selectively tunable second reflection coefficient;

said first and second circuit means being configured so as to define said first and second reflection coefficients for selectively and simultaneously varying the phase angle and amplitude of the output signal within an angular range and amplitude range determined by the first and second reflection coefficients.

2. The circuit of claim 1, wherein said first circuit means comprises a resistor, said second circuit means comprises an inductance element, a variable value capacitance element and a variable resistor arranged in parallel, and wherein the amplitude and phase angle of the output signal are varied by adjusting the values of the variable capacitance element and variable resistor.

3. The circuit of claim 1, wherein said first circuit means comprises a variable resistor, said second circuit means comprises a parallel arrangement of an inductance element, a variable value capacitance element and a resistor, and wherein the phase angle of the output signal is varied by adjusting the values of the variable capacitance element of the second circuit means and the variable resistor of the first circuit means.

4. The circuit of claim 3, wherein said quadrature hybrid has a characteristic impedance value and wherein said resistor has a value less than said characteristic impedance value.

5. The circuit of claim 2, wherein said quadrature hybrid has a characteristic impedance value and wherein the resistor in said first circuit means has a value less than said characteristic impedance value.

6. The circuit of claim 1, wherein said first circuit means comprises a resistor, said second circuit means comprises an inductance element, a variable value capacitance element and a variable resistor arranged in series, and wherein the amplitude and phase angle of the output signal are varied by adjusting the values of the variable capacitance element and variable resistor.

7. The circuit of claim 6, wherein said quadrature hybrid has a characteristic impedance value and wherein said resistor has a value greater than said characteristic impedance value.

8. The circuit of claim 1, wherein said first circuit means comprises a variable resistor, said second circuit means comprises a series arrangement of an inductance element, a variable value capacitance element and a resistor, and wherein the phase angle of the output signal is varied by adjusting the values of the variable capacitance element of the second circuit means and the variable resistor of the first circuit means.

9. The circuit of claim 8, wherein said quadrature hybrid has a characteristic impedance value and said resistor has a value less than said characteristic impedance value.

10. The circuit of claim 1, wherein said predetermined angular range includes angles between about 0° and 360°.

11. The circuit of claim 1, wherein the first and second circuit means are configured to selectively define said first and second reflection coefficients.

12. A transmitter circuit for combining an input signal having a frequency component and a corresponding phase angle, with a local oscillator signal for forming a combined signal and for removing unwanted portions of the local oscillator signal from the combined signal said transmitter circuit comprising:

an input for receiving the input signal and the local oscillator signal to form a combined signal;

a phase adjust circuit for adjusting a phase angle and amplitude of the unwanted portions of the local oscillator signal having a frequency and a phase angle, said phase adjust circuit comprising a quadrature hybrid having a first port, a second port, a third port and a fourth port, said first port receiving the local oscillator signal and said fourth port outputting a phase adjust circuit output signal having the frequency of the local oscillator signal with a different amplitude than the amplitude of the local oscillator signal and a corresponding phase angle;

a first circuit means having a first impedance value and connected to one of said second and third ports for defining a first reflection coefficient;

a second selectively tuneable circuit means having a second selectively variable impedance value and connected to the other of said second and third ports for defining a selectively tuneable second reflection coefficient; and a combiner connected to the fourth port and receiving the combined signal for adding the combined signal to the phase adjust circuit output signal;

said first and second circuit means being configured so as to define said first and second coefficients for selectively varying the amplitude and phase angle of the phase adjust circuit output signal within a predetermined amplitude range and angular range determined by the first and second reflection coefficients to offset and effectively cancel the unwanted portions of the local oscillator signal from the combined signal.

13. The circuit of claim 12, wherein said first circuit means comprises a resistor, said second circuit means comprises an inductance element, a variable value capacitance element and a variable resistor arranged in parallel, and wherein the phase angle of the phase adjust circuit output signal is varied by adjusting the value of the variable capacitance element and variable resistor.

14. The circuit of claim 13, wherein said quadrature hybrid has a characteristic impedance value and wherein said resistor in said first circuit means has an impedance value less than the characteristic impedance value of said quadrature hybrid.

15. The circuit of claim 12, wherein said first circuit means comprises a variable value tuneable resistor having a predetermined tuning range and wherein said second circuit means comprises an inductor, a variable capacitance element and a resistor, arranged in parallel, and wherein the amplitude and phase angle of the phase adjust output signal is varied by adjusting the tuneable resistor and variable capacitance element.

16. The circuit of claim 15, wherein said quadrature hybrid has a characteristic impedance value, and wherein the resistor of said second circuit means has a value less than said characteristic impedance value.

17. The circuit of claim 12, wherein said first circuit means comprises a resistor and wherein said second circuit means comprises a series arrangement of an inductance element, a variable value capacitance element and a variable value tuneable resistor, and wherein the amplitude and phase angle of the phase adjust output signal is varied by adjusting the value of the variable capacitance element and variable resistor.

18. The circuit of claim 12, wherein said first circuit means comprises a variable value tuneable resistor and wherein said second circuit means comprises a series arrangement of an inductance element, a variable value capacitance element and a resistor, and wherein the amplitude and phase angle of the phase adjust output signal is varied by adjusting the value of the variable capacitance element and variable resistor.

19. The circuit of claim 12, wherein said predetermined angular range includes angles between about 0° and 360°.

* * * * *